(12) United States Patent
Nakata

(10) Patent No.: US 11,424,283 B2
(45) Date of Patent: Aug. 23, 2022

(54) PHOTOELECTRIC CONVERSION APPARATUS, IMAGING SYSTEM AND MOBILE BODY

(71) Applicant: CANON KABUSHIKI KAISHA, Tokyo (JP)

(72) Inventor: Yasushi Nakata, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 185 days.

(21) Appl. No.: 16/848,946

(22) Filed: Apr. 15, 2020

(65) Prior Publication Data

US 2020/0343292 A1  Oct. 29, 2020

(30) Foreign Application Priority Data

Apr. 26, 2019 (JP) .............................. JP2019-085736

(51) Int. Cl.
*H01L 27/146* (2006.01)

(52) U.S. Cl.
CPC .... *H01L 27/14636* (2013.01); *H01L 27/1464* (2013.01)

(58) Field of Classification Search
CPC ............ H01L 27/1464; H01L 27/1463; H01L 27/14636; H01L 31/02165
See application file for complete search history.

(56) References Cited

U.S. PATENT DOCUMENTS

| 8,866,205 B2 | 10/2014 | Nakata et al. |
| 9,681,078 B2 | 6/2017 | Tsuchiya et al. |
| 2020/0411570 A1* | 12/2020 | Noudo .................... H04N 5/359 |

FOREIGN PATENT DOCUMENTS

JP           2011-003860 A         1/2011

OTHER PUBLICATIONS

U.S. Appl. No. 16/848,953, filed Apr. 15, 2020 (First Named Inventor: Yasushi Nakata).

* cited by examiner

*Primary Examiner* — Tucker J Wright
(74) *Attorney, Agent, or Firm* — Venable LLP

(57) ABSTRACT

A photoelectric conversion apparatus, including: a photoelectric conversion unit that converts received light into charges; and an optical structure that is disposed on the opposite side of a light-receiving surface of the photoelectric conversion unit, wherein the optical structure includes a plurality of first insulating parts and a plurality of second insulating parts, wherein a refractive index of the first insulating part is lower than a refractive index of the second insulating part, wherein at least one of the first insulating part and the second insulating part is disposed at intervals shorter than a wavelength of a detection target light, and wherein an effective refractive index of the optical structure is lowest at a reference point and increases as the distance from the reference point increases, or is highest at the reference point and decreases as the distance from the reference point increases.

15 Claims, 14 Drawing Sheets

PHOTOELECTRIC CONVERSION APPARATUS, IMAGING SYSTEM AND MOBILE BODY

BACKGROUND OF THE INVENTION

Field of the Invention

The present invention relates to a photoelectric conversion apparatus, an imaging system and a mobile body.

Description of the Related Art

An imaging apparatus (photoelectric conversion apparatus), such as a CMOS image sensor and a CCD image sensor, is widely used for digital still cameras, digital video cameras and the like.

Recently a back-illuminated imaging apparatus has been commercialized. In this imaging apparatus, light is irradiated to the back surface side of the semiconductor substrate on which photodiodes and transistors are formed, that is, to the opposite side of the front surface where a wiring layer is formed. In the case of a back-illuminated solid-state imaging apparatus, the wiring layer, circuit elements and the like are not disposed on the light irradiation side, hence the opening ratio of the light-receiving portion formed on the semiconductor substrate can be increased, and the incident light can enter the light-receiving portion without being reflected by the wiring layer or the like, whereby the sensitivity of the imaging apparatus can be improved.

On the other hand, in the case of the back-illustrated solid-state imaging apparatus, optical noise may be generated by light leaking into adjacent pixels when a diagonal light enters.

Therefore Japanese Patent Application Publication No. 2011-3860, for example, discloses a solid-state imaging apparatus where a trench is formed in a semiconductor substrate, and the trench portion is constituted of light-shielding film, so that the leaking of light into adjacent pixels is prevented.

In other words, in the case of the solid-state imaging apparatus according to Japanese Patent Application Publication No. 2011-3860, the light that directly enters the adjacent pixels is blocked by constituting the trench portion using light-shielding film.

The light that enters the light-receiving portion, however, may be reflected by the interface between the semiconductor substrate and the wiring layer, or by the wires in the wiring layer, and indirectly enter the adjacent pixels. In this case, the leaking of light into the adjacent pixels may generate optical noises and deteriorate pixel signals.

SUMMARY OF THE INVENTION

It is an object of the present invention to provide a photoelectric conversion apparatus that can generate more satisfactory pixel signals.

The first aspect of the disclosure is a photoelectric conversion apparatus, including: a photoelectric conversion unit that converts received light into charges; and an optical structure that is disposed on the opposite side of a light-receiving surface of the photoelectric conversion unit, wherein the optical structure includes a plurality of first insulating parts and a plurality of second insulating parts, wherein a refractive index of the first insulating part is lower than a refractive index of the second insulating part, wherein at least one of the first insulating part and the second insulating part is disposed at intervals shorter than a wavelength of a detection target light, and wherein an effective refractive index of the optical structure is lowest at a reference point and increases as the distance from the reference point increases, or is highest at the reference point and decreases as the distance from the reference point increases.

The second aspect of the disclosure is a photoelectric conversion apparatus, including: a photoelectric conversion unit that converts received light into charges; and an optical structure that is disposed on the opposite side of the light-receiving surface of the photoelectric conversion unit, wherein the optical structure includes a plurality of first insulating parts and a plurality of second insulating parts, wherein a refractive index of the first insulating part is lower than a refractive index of the second insulating part, wherein at least one of the first insulating part and the second insulating part is disposed at intervals shorter than a wavelength of a detection target light, and wherein a volume ratio of the second insulating part in the optical structure is lowest at a reference point and increases as the distance from the reference point increases, or is highest at the reference point and decreases as the distance from the reference point increases.

The third aspect of the disclosure is a photoelectric conversion apparatus, including: a photoelectric conversion unit that converts received light into charges; and an optical structure that is disposed on the opposite side of a light-receiving surface of the photoelectric conversion unit, wherein the optical structure is disposed on the surface of a wiring layer which is adjacent to the semiconductor substrate on which the photoelectric conversion unit is disposed, wherein the optical structure includes a plurality of first insulating parts and a plurality of second insulating parts, wherein a refractive index of the first insulating part is lower than a refractive index of the second insulating part, wherein the first insulating part and the second insulating part are ring-shaped or polygonal ring-shaped, and are disposed alternately, wherein at least one of the first insulating part and the second insulating part has a width that is shorter than a wavelength of a detection target light, and wherein (1) the width of the first insulating part increases as the distance from a reference point decreases, and decreases as the distance from the reference point increases, and/or (2) the width of the second insulating part decreases as the distance the reference point decreases, and increases as the distance from the reference point increases.

The fourth aspect of the disclosure is a photoelectric conversion apparatus, including: a photoelectric conversion unit that converts received light into charges; and an optical structure that is disposed on the opposite side of the light-receiving surface of the photoelectric conversion unit, wherein the optical structure is disposed inside a wiring layer which is adjacent to the semiconductor substrate on which the photoelectric conversion unit is disposed, wherein the optical structure includes a plurality of first insulating parts and a plurality of second insulating parts, wherein a refractive index of the first insulating part is lower than a refractive index of the second insulating part, wherein the first insulating part and the second insulating part are ring-shaped or polygonal ring-shaped, and are disposed alternately, wherein at least one of the first insulating part and the second insulating part has a width that is shorter than a wavelength of a detection target light, and wherein (1) the width of the first insulating part decreases as the distance from a reference point decreases, and increases as the distance from the reference point increases, and/or (2) the width of the second insulating part increases as the distance from the reference point decreases, and decreases as the distance from the reference point increases.

According to the present invention, more satisfactory pixel signals can be generated.

Further features of the present invention will become apparent from the following description of exemplary embodiments with reference to the attached drawings.

DESCRIPTION OF THE EMBODIMENTS

A photoelectric conversion apparatus according to each embodiment will be described with reference to the drawings. The present invention is, however, not limited by these embodiments.

First Embodiment

A photoelectric conversion apparatus according to the first embodiment is a CMOS image sensor. Generally speaking, a CMOS image sensor includes a pixel array unit, a vertical drive unit, a column processing unit, a horizontal drive unit, and a system control unit. In the pixel array unit, a unit pixel, that includes a photoelectric conversion element, which generates photo-charges for a charge amount in accordance with the incident light quantity and stores the photo-charges therein, is two-dimensionally arrayed. If the photoelectric conversion apparatus is used simply as an optical sensor, instead of as an image sensor, the photoelectric conversion apparatus may have at least one pixel, and need not have a plurality of pixels.

Figure 1:
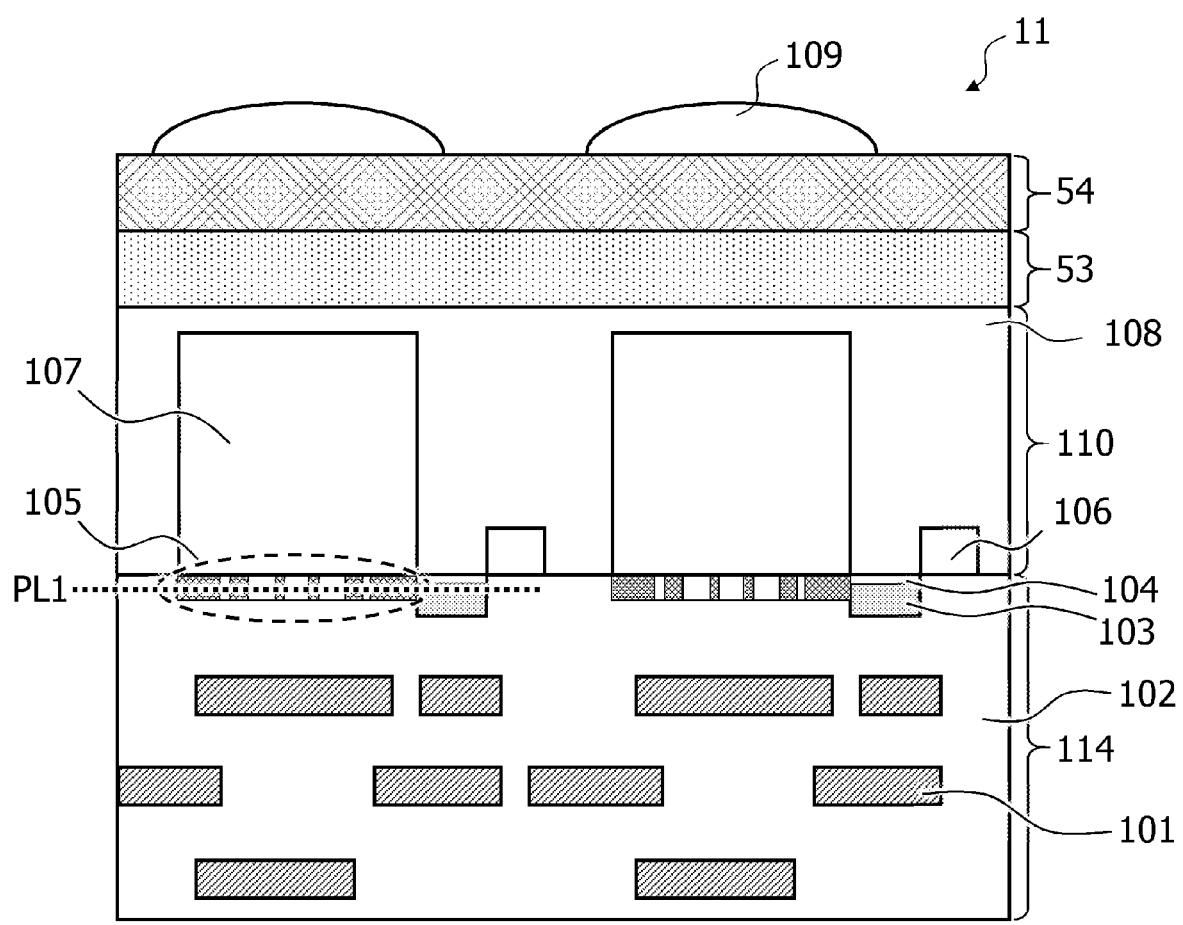
FIG. 1 is a cross-sectional view depicting a configuration example of a pixel according to Embodiment 1.

FIG. 1 is a cross-sectional view depicting a configuration example of a pixel according to the first embodiment. As illustrated in FIG. 1, the pixel 11 is constituted of a wiring layer 114, a semiconductor substrate 110, a dielectric material layer 53, a color filter layer 54, and an on-chip lens 109, which are stacked in sequence from the bottom in FIG. 1. The pixel 11 constitutes a back-illuminated CMOS image sensor, where incident light is irradiated to the surface of the semiconductor substrate 110 from the upper surface in FIG. 1. FIG. 1 indicates only two pixels to simplify description, but many pixels are two-dimensionally arrayed in the CMOS image sensor.

The wiring layer 114 includes a plurality of layers of wires 101, and is formed on the opposite side of the light-receiving surface of a photoelectric conversion unit 107. The wiring layer 114 is supported by a substrate support member (not illustrated), for example, which is disposed on the lower side of the wiring layer 114, and is configured such that the plurality of wires 101, which reads charges of the photoelectric conversion unit 107 formed in the semiconductor substrate 110, for example, are embedded in an interlayer insulating film 102. The wires 101 are formed of a conductor (e.g. aluminum, copper), for example. The interlayer insulating film 102 is formed of silicon oxide, for example. The image sensor can be driven at high-speed by forming a circuit to read charges in the wiring layer 114, and forming an AD conversion circuit and circuits in the subsequent stages in the substrate support member.

In the wiring layer 114, a transfer gate 103 is disposed for the semiconductor substrate 110, in a region between a floating diffusion layer 106 and the photoelectric conversion unit 107, via an oxide film 104. Charges stored in the photoelectric conversion unit 107 are transferred to the floating diffusion layer 106 by a predetermined voltage that is applied to the transfer gate 103. The oxide film 104 has insulation properties, and is formed of silicon oxide, for example.

In the case of the above mentioned configuration, that is, a configuration which does not include a planar lens structure (optical structure) in the wiring layer 114, part of the light collected by the on-chip lens 109 may be reflected by the interface between the wiring layer 114 and the semiconductor substrate 110, and enter the adjacent photoelectric conversion units 107.

In recent years, it has become possible to form micro patterns of which size is the wavelength of incident light or less (sub-wavelength region), as the process technique, represented by photolithography and electron beam lithography, advances. Therefore an optical structure or planar lens structure (sub-wavelength lens: SWLL) can be implemented by forming materials having different refractive indexes to be a cyclic structure of sub-wavelength regions. The "sub-wavelength region" refers to a region where the wavelength is equal to or smaller than the wavelength of the target light.

In the first embodiment, the wavelength range of the visible light (400 nm to 750 nm) or the wavelength range of the visible light and near infrared light (400 nm to 1100 nm) is detected. However the first embodiment may be configured to detect light in a wider wavelength range or narrower wavelength range.

In the first embodiment, the planar lens structure 105 is disposed on a plane PL1 of the wiring layer 114 so as to contact the semiconductor substrate 110, in order to prevent entry of light reflected by the interface between the wiring layer 114 and the semiconductor substrate 110 into the adjacent photoelectric conversion units 107. The plane PL1 is the surface or the wiring layer 114.

Figure 2:
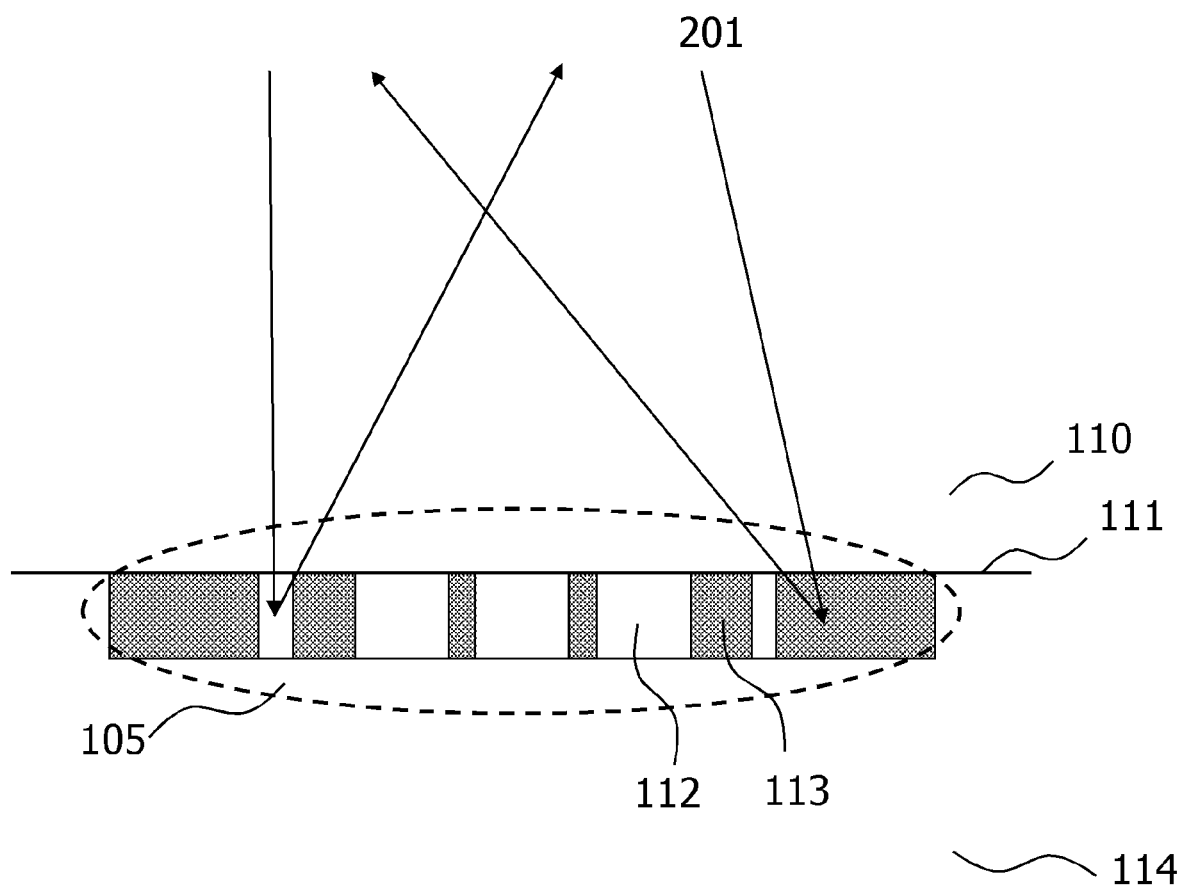
FIG. 2 is a diagram depicting a planar lens structure according to Embodiment 1.

FIG. 2 is an enlarged view of the planar lens structure 105 in FIG. 1. In the example illustrated in FIG. 2, the planar lens structure 105 is configured by the structure enclosed by the dotted line, that is, a cyclic structure constituted of a first insulating part 112 (including a second insulating part 113 in the outermost periphery) and the second insulating part 113.

The planar lens structure 105 is formed on the surface of the wiring layer 114, so as to contact the interface 111 between the semiconductor substrate 110 and the wiring layer 114. The planar lens structure 105 is constituted of a plurality of first insulating parts 112 and a plurality of second insulating parts 113, and the refractive index of the first insulating part 112 is lower than the refractive index of the second insulating part 113. At least one of the first insulating part 112 and the second insulating part 113 has a width narrower than the wavelength region of the light detected by the photoelectric conversion unit 107. In other words, the first insulating part 112 and the second insulating part 113 are alternately disposed, and at least one of the first insulating part 112 and the second insulating part 113 has a width narrower than the wavelength of the detection target light. For example, if the semiconductor substrate 110 is formed of silicon, the interlayer insulating film 102 and the first insulating part 112 may be formed of silicon oxide, and the second insulating part 113 may be formed of a silicon compound which includes carbon, oxygen or nitrogen.

The first insulating part 112 and the second insulating part 113 are disposed so that the effective refractive index in the planar lens structure 105 is lowest at the center and increases as the distance from the center increases. Therefore the volume ratio of the second insulating part 113 in the planar lens structure 105 gradually increases from the center region to the peripheral region of the planar lens structure 105. The effective refractive index is an average refractive index in regions of which size is the same as or more than the wavelength of the detection target light.

By this configuration, the planar lens structure 105 can implement an effect similar to the lens structure of which upper surface is concave. Because of the concave lens effect of the planar lens structure 105, a ray 201 having an angle exceeding the angle of total reflection is reflected toward the center of the planar lens structure 105. If the first insulating part 112 and the second insulating part 113 are formed of silicon oxide, the first insulating part 112 and the second insulating part 113 are formed by films of which refractive indexes are different. By this configuration, entry of light reflected by the interface 111 into the adjacent photoelectric conversion units 107 can be prevented and sensitivity can be increased, whereby more satisfactory pixel signals can be generated.

It is preferable that the planar lens structure 105 is disposed so that the outermost periphery of the planar lens structure 105 covers the photoelectric conversion unit 107, as illustrated in FIG. 1. Then it can effectively prevent the entry of light, which is collected by the on-chip lens 109 and reflected by the interface 111, into the adjacent photoelectric conversion units. However the quantity of light that enters the edge of the photoelectric conversion unit 107 is minimal, hence the planar lens structure 105 may cover only part of the photoelectric conversion unit 107 (e.g. center portion) and not cover the edge.

Figure 3:
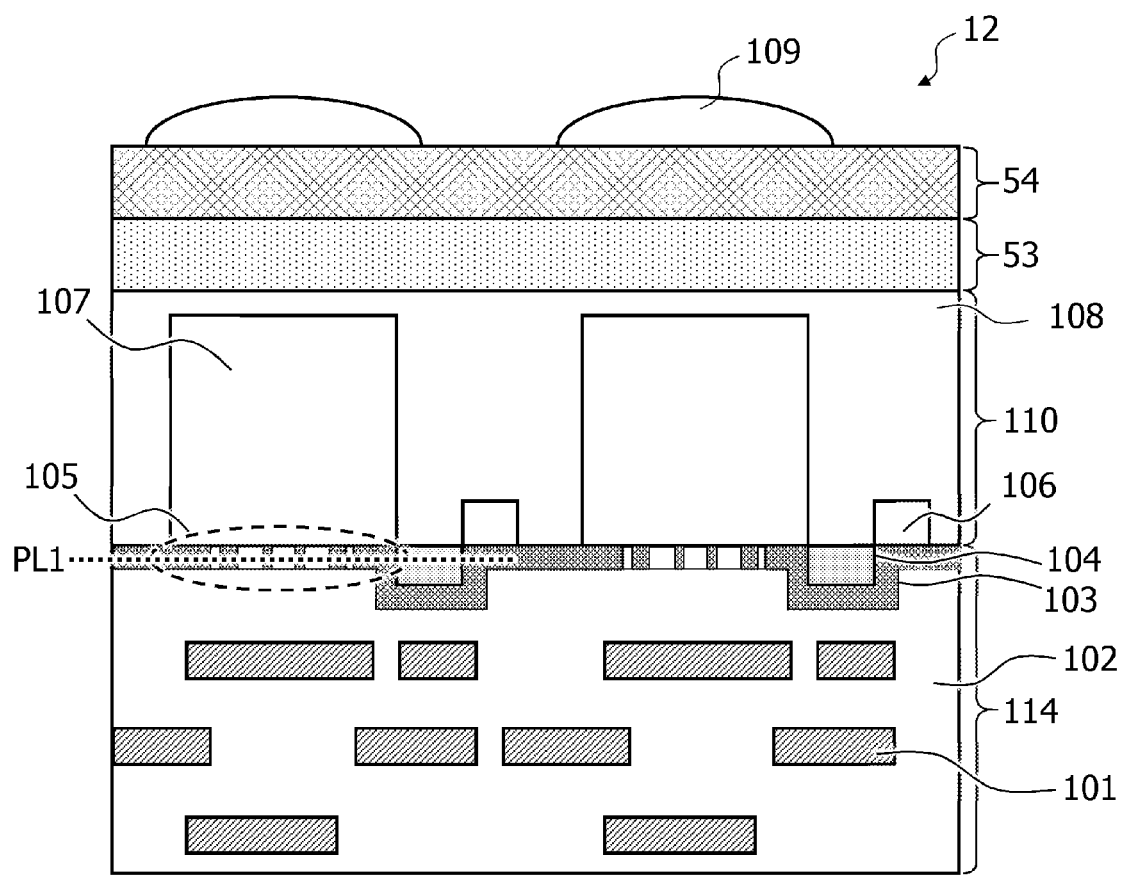
FIG. 3 is a diagram depicting another configuration example of a pixel according to Embodiment 1.

In FIG. 1, the planar lens structure 105 is disposed so as to cover the photoelectric conversion unit 107, but as illustrated in FIG. 3, the pixel 12 may be disposed so that the pixel region, excluding the region of the photoelectric conversion unit 107, is covered by the second insulating part 113. By this configuration, the interface, at which change of reflective index is large, can be decreased even in the pixel region excluding the region of the photoelectric conversion unit 107, and a further decrease in the reflected light at the interface between the semiconductor substrate 110 and the wiring layer 114 can be implemented.

Figure 4A:
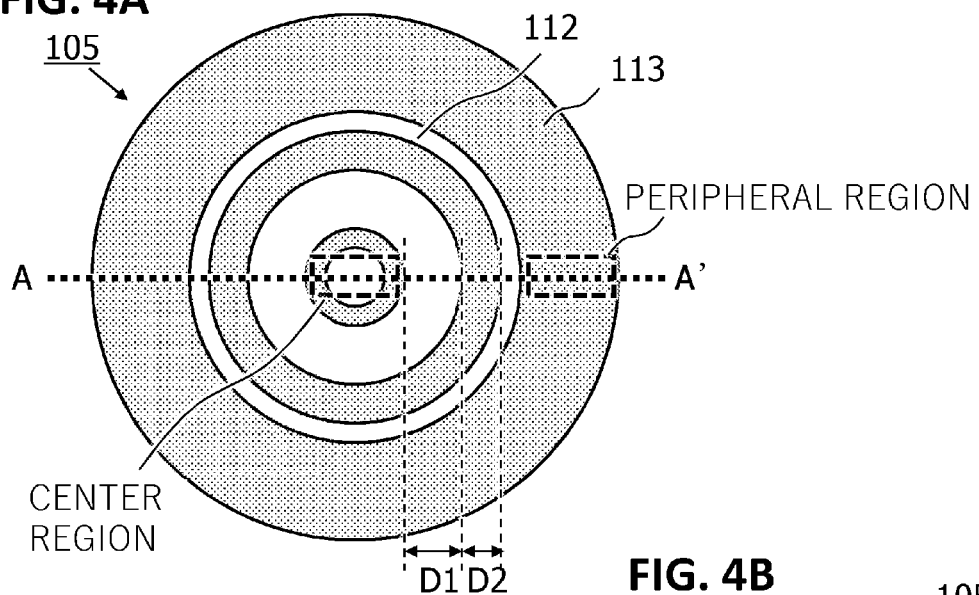
FIG. 4A to FIG. 4C are diagrams depicting layout pattern examples of the planar lens structure of Embodiment 1.
Figure 4B:
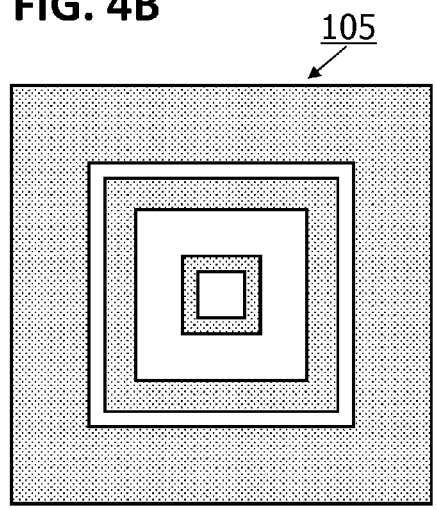
Figure 4C:
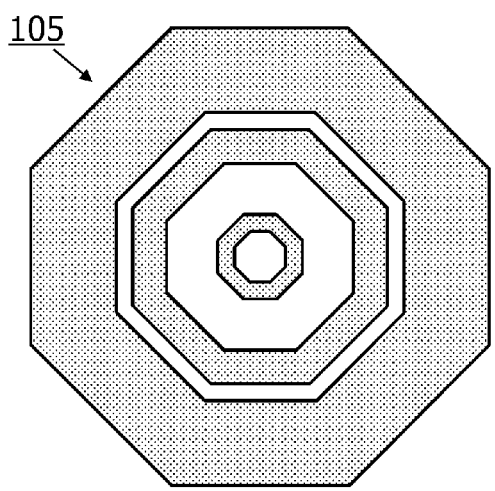

An example of the layout pattern in the planar lens structure 105 illustrated in FIG. 1 will be described with reference to FIG. 4A to FIG. 4C. FIG. 4A to FIG. 4C are diagrams depicting examples of the layout pattern in the planar lens structure 105. In FIG. 4A to FIG. 4C, the hatched regions are regions of the second insulating parts 113, and the white regions between the hatched region are regions of the first insulating parts 112.

The layout pattern illustrated in FIG. 4A is disposed on the plane PL1 in FIG. 1, and is a pattern where the ring-shaped first insulating part 112 and the ring-shaped second insulating part 113 are alternately disposed concentrically. The concentric ring pattern is formed so that the second insulating part 113 has a predetermined volume ratio distribution, which is required in the planar lens structure 105. In the center region of the concentric circles of the planar lens structure 105, the volume ratio of the second insulating part 113, which has a refractive index higher than the refractive index of the first insulating part 112, is small. In the peripheral region of the concentric circles of the planar lens structure 105, the volume ratio of the second insulating part 113 having the higher refractive index is large. Thereby the effective refractive index of the center region of the planar lens structure 105 becomes lower than the effective refractive index of the peripheral region. The center region and the peripheral region are plane regions of which both sides have a length similar to the wavelength region of the light detected by the photoelectric conversion unit 107. In other words, the denominator of the volume ratio is a value determined by multiplying the area of the plane region by the height of the planar lens structure 105. The numerator of the volume ratio is a value determined by multiplying an area occupied by the first insulating part 112 or the second insulating part 113 in the plane region by the height of the planar lens structure 105.

Figure 5:
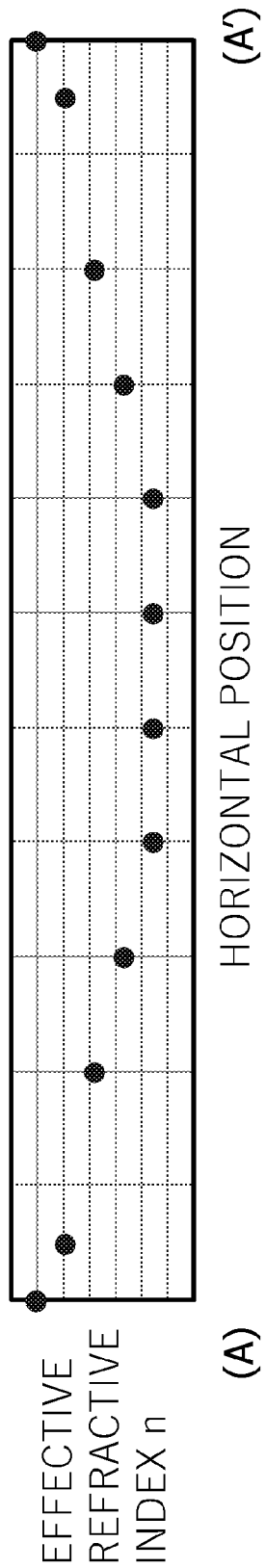
FIG. 5 is a diagram depicting a distribution of the effective refractive index of the layout pattern illustrated in FIG. 4A.

In the layout pattern illustrated in FIG. 4A, the effective refractive index was calculated at a plurality of points in the AA' cross-section, and the simulation result in FIG. 5 was acquired. The effective refractive index is a numerical value that indicates a substantial refractive index at a certain position with respect to a wavelength of a certain incident light, and is approximately the same as the average value of the refractive indexes in the vicinity of the position.

The plane pattern is a micro pattern that is not more than the wavelength, hence films having different refractive indexes exist at a cycle shorter than the wavelength. As illustrated in FIG. 4A, the volume ratio of the second insulating part 113 is small in the center region of the concentric circles of the planar lens structure 105, and the volume ratio of the second insulating part 113 is large in the peripheral region of the concentric circles of the planar lens structure 105. As a result, the effective refractive index is lowest at the center region of the concentric circles and increases as the distance from the peripheral region decreases.

In FIG. 4A, it is assumed that the width of the first insulating part 112 is D1, and the width of the second insulating part 113 is D2. The width D1 and the width D2 are the length of the first insulating part 112 and the length of the second insulating part 113 on an arbitrary line passing through the center of the planar lens structure 105 (e.g. AA'). In the case of the example illustrated in FIG. 4A, the width D1 of the first insulating part 112 is formed to be larger as the distance from the center decreases, and smaller as the distance from the center increases. The width D2 of the second insulating part 113 is formed to be smaller as the distance from the center decreases, and larger as the distance from the center increases. Then the volume ratio of the second insulating part 113 decreases as the distance from the center region decreases, and the volume ratio of the second insulating part 113 increases as the distance from the peripheral region decreases. In other words, the effective refractive index decreases as the distance from the center region decreases, and the effective refractive index increases as the distance from the peripheral region decreases.

However a plane pattern other than the pattern of simultaneously changing the width D1 of the first insulating part 112 and the width D2 of the second insulating part 113 may be used. For example, a pattern of increasing the width D2 of the second insulating part 113 as the distance from the center increases, without changing the width D1 of the first insulating part 112, or a pattern of decreasing the width D1 of the first insulating part 112 as the distance from the center increases, without changing the width D2 of the second insulating part 113, may be used.

The method of changing the volume ratio of the second insulating part 113 in the planar lens structure 105 is not limited to the above examples. In the example illustrated in FIG. 2, the heights of the first insulating part 112 and the second insulating part 113 are constant, but the heights of the first insulating part 112 and the second insulating part 113 may be changed depending on the position.

By this configuration, a ray 201 having an angle exceeding the angle of total reflection is reflected toward the center of the concentric circles, and entry of the reflected light into the adjacent photoelectric conversion units can be decreased. Thereby more satisfactory pixel signals can be generated.

In the same manner, the layout pattern illustrated in FIG. 4B is disposed on the plane PL1 in FIG. 1, and is a pattern where a square ring-shaped first insulating part 112 and second insulating part 113 are alternately disposed concentrically. The concentric square ring-shaped pattern is formed to have a predetermined volume ratio distribution, which is required in the planar lens structure 105. In the center region of the concentric squares of the planar lens structure 105, the volume ratio of the second insulating part 113, which has a refractive index higher than the refractive index of the first insulating part 112, is small. In the peripheral region of the concentric squares of the planar lens structure 105, the volume ratio of the second insulating part 113, having a higher refractive index, is large. Thereby the effective refractive index of the center region of the planar lens structure 105 becomes lower than the effective refractive index of the peripheral region.

In the same manner, the layout pattern illustrated in FIG. 4C is disposed on the plane PL1 in FIG. 1, and is a pattern where a polygonal ring-shaped (e.g. hexagonal ring-shaped) first insulating part 112 and second insulating part 113 are alternately disposed concentrically. In FIG. 4C, the polygonal ring-shaped pattern is a hexagon, but may be other polygonal ring-shaped patterns. The concentric polygonal ring-shaped pattern is formed to have a predetermined volume ratio distribution, which is required in the planar lens structure 105. In the center region of the concentric polygons of the planar lens structure 105, the volume ratio of the second insulating part 113, which has a refractive index higher than the refractive index of the first insulating part 112, is small. In the peripheral region of the concentric polygons of the planar lens structure 105, the volume ratio of the second insulating part 113, which has a higher refractive index, is large. Thereby the effective refractive index of the center region of the planar lens structure 105 becomes lower than the effective refractive index of the peripheral region.

Figure 6A:
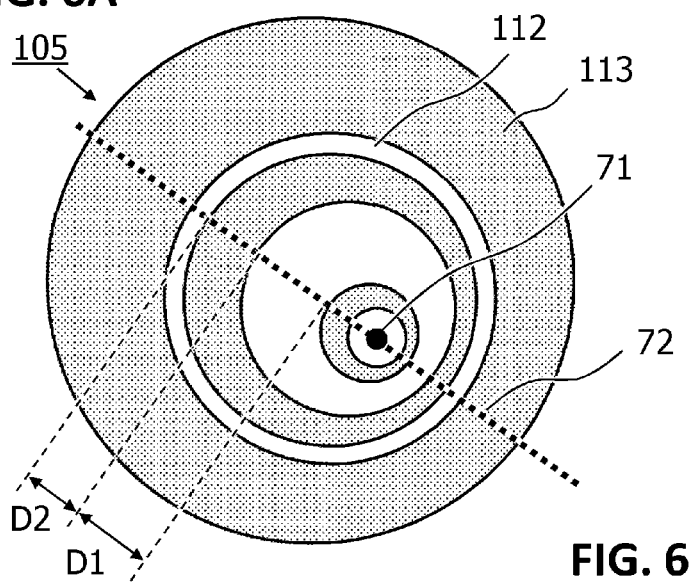
FIG. 6A to FIG. 6C are diagrams depicting other layout pattern examples of the planar lens structure of Embodiment 1.
Figure 6B:
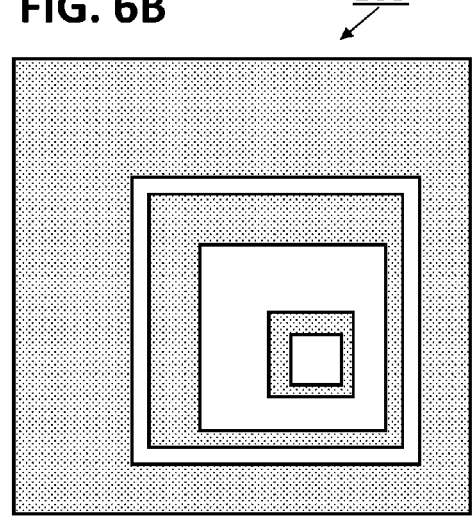
Figure 6C:
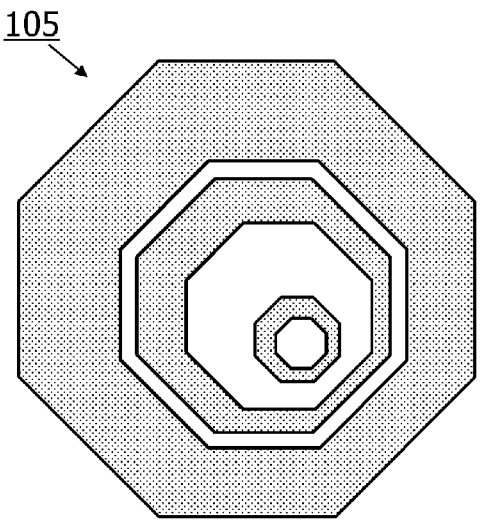

In the case where the inclination of the incident light is different depending on the position of the pixel in the pixel array, the volume rate distribution in the planar lens structure 105 of the layout pattern may be decentered, as illustrated in FIG. 6A to FIG. 6C. By this configuration, entry of the light reflected by the interface between the semiconductor substrate 110 and the wiring layer 114 into the adjacent photoelectric conversion units can be more effectively decreased.

In the patterns illustrated in FIG. 6A to FIG. 6C, the position where the effective refractive index is smallest deviates from the center of the planar lens structure 105 or the center of the photoelectric conversion unit 107. Hereafter the position where the effective refractive index is smallest in the planar lens structure 105 is called a reference point. In these examples, on an arbitrary line 72 passing through the reference point 71 of the planar lens structure 105, the width D1 of the first insulation part 112 is formed to be larger as the distance from the reference point 71 decreases, and smaller as the distance from the reference point 71 increases. The width D2 of the second insulating part 113 is formed to be smaller as the distance from the reference point 71 decreases, and larger as the distance from the reference point 71 increases. Here it is assumed that the width D1 and the width D2 in FIG. 6A to FIG. 6C are, in concrete terms, the lengths of the first insulation part 112 and the second insulating part 113 on the arbitrary line 72 passing through the reference point 71 of the planar lens structure 105. Then the volume ratio of the second insulating part 113 becomes smaller in the region as the distance from the reference point 71 decreases, and the volume ratio of the second insulating part 113 becomes larger in the region as the distance from the reference point 71 increases. In other words, the effective refractive index decreases in the region as the difference from the reference point 71 decreases, and the effective refractive index increases in the region as the distance from the reference point 71 increases.

The patterns in FIG. 4A to FIG. 4C are regarded as patterns in the case when the reference point matches with the center of the planar lens structure 105 or the center of the photoelectric conversion unit 107.

The planar lens structure 105 may be formed as a pattern that is different from the pattern where the ring-shaped or polygonal ring-shaped first insulating part 112 and the second insulating part 113 are alternately disposed. Any pattern may be used as long as the pattern forms a concave lens, where the effective refractive index of the planar lens structure 105 is smallest at the reference point, and increases as the distance from the reference point increases. For example, a layout pattern, where the first insulating part 112 and the second insulating part 113 are disposed in a checked pattern, and the size of each insulating part is different depending on the position, may be used for the planar lens structure.

Second Embodiment

Figure 7:
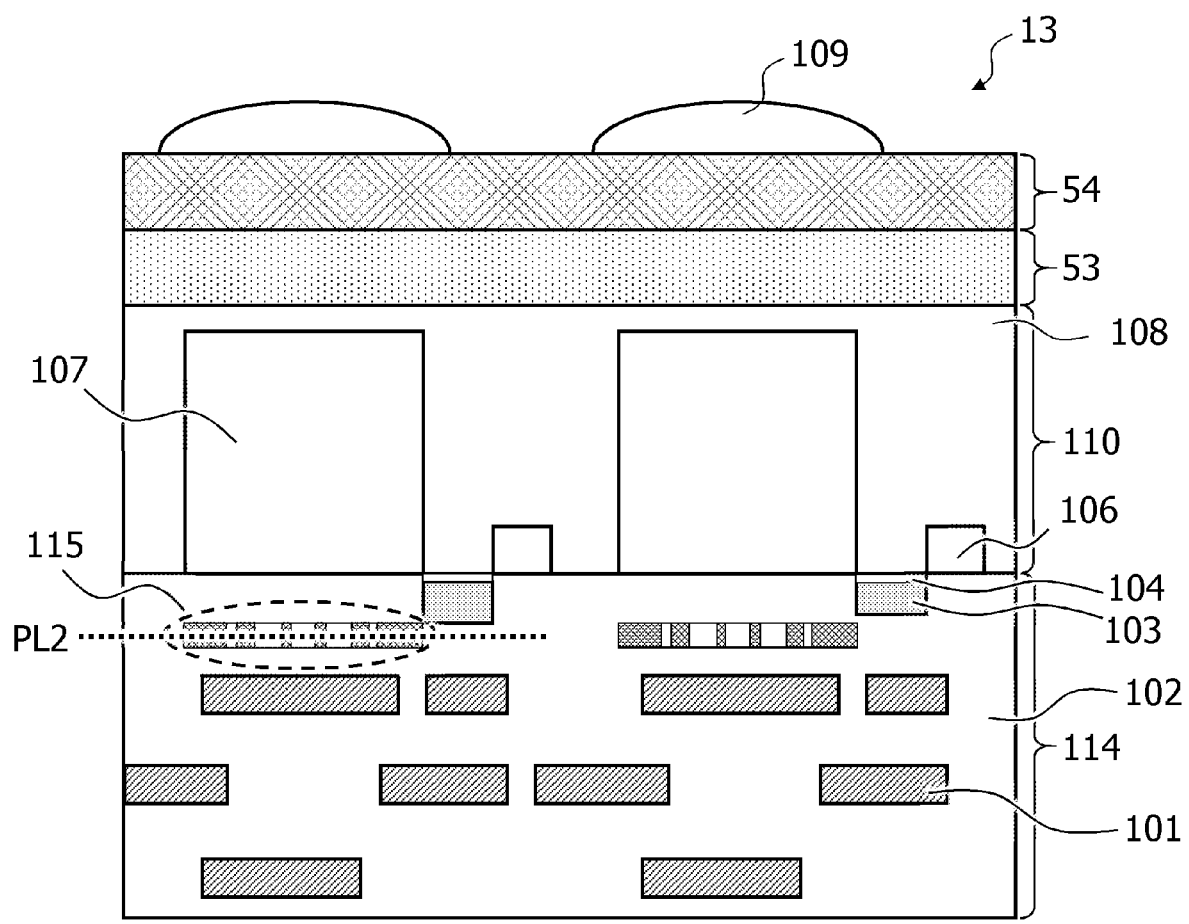
FIG. 7 is a cross-sectional view depicting a configuration example of a pixel according to Embodiment 2.

FIG. 7 is a cross-sectional view depicting a configuration example of a pixel according to the second embodiment.

As illustrated in FIG. 7, the pixel 13 is constituted of a wiring layer 114, a semiconductor substrate 110, a dielectric material layer 53, a color filter layer 54, and an on-chip lens 109, which are stacked in sequence from the bottom in FIG. 7.

The pixel 13 constitutes a back-illuminated CMOS image sensor, where the incident light is irradiated to the surface of the semiconductor substrate 110 from the upper surface in FIG. 7. FIG. 7 indicates only two pixels to simplify description, but many pixels are two-dimensionally arrayed in the CMOS image sensor.

The wiring layer 114 includes a plurality of layers of wires 101, and is formed on the opposite side of the light-receiving surface of a photoelectric conversion unit 107. The wiring layer 114 is supported by a substrate support member (not illustrated), for example, which is disposed on the lower side of the wiring layer 114, and is configured such that the plurality of wires 101, which reads charges of the photoelectric conversion unit 107 formed in the semiconductor substrate 110, are embedded in an interlayer insulating film 102. The wire 101 is formed of a conductor (e.g. aluminum, copper), for example. The interlayer insulating film 102 is formed of silicon oxide, for example.

In the wiring layer 114, a transfer gate 103 is disposed for the semiconductor substrate 110, in a region between a floating diffusion layer 106 and the photoelectric conversion unit 107, via an oxide film 104. Charges stored in the photoelectric conversion unit 107 are transferred to the floating diffusion layer 106 by a predetermined voltage that is applied to the transfer gate 103. The oxide film 104 has insulation properties, and is formed of silicon oxide, for example.

In the case of the above mentioned configuration, that is, a configuration which does not include a lens structure (optical structure) in the wiring layers 114, a part of the light collected by the on-chip lens 109 may be reflected by the wire 101 and enter the adjacent photoelectric conversion unit 107.

In the second embodiment, a planar lens structure 115 is disposed on a plane PL2 between the wires 101 and the semiconductor substrate 108, in order to prevent entry of the light reflected by the wires 101 in the wiring layer 114 into the adjacent photoelectric conversion units 107. The plane PL2 is a surface that is separate from the surface of the wiring layer 114 by a predetermined distance, and is parallel with the surface.

Figure 8:
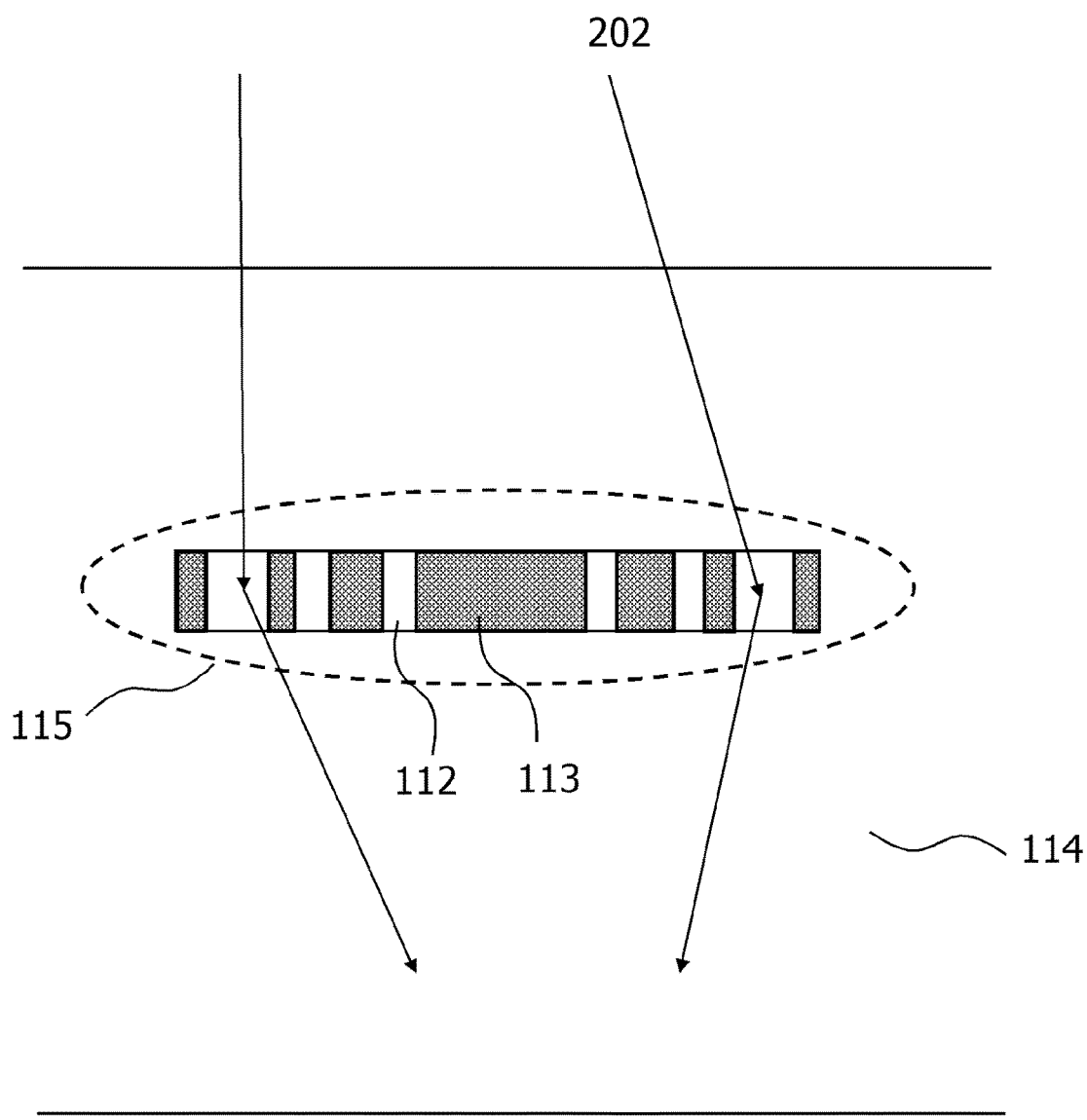
FIG. 8 is a diagram depicting a planar lens structure according to Embodiment 2.

FIG. 8 is an enlarged view of the planar lens structure (optical structure) 115 in FIG. 7. In the example illustrated in FIG. 8, the planar lens structure 115 is configured by the structure enclosed by the dotted line, that is, a cyclic structure constituted of a first insulating part 112 (including a second insulating part 113 in the outermost periphery) and the second insulating part 113.

The planar lens structure 115 is formed inside the wiring layer 114. The planar lens structure 115 is constituted of a plurality of first insulating parts 112 and a plurality of second insulating parts 113, and the refractive index of the first insulating part 112 is lower than the refractive index of the second insulating part 113. The first insulating part 112 and the second insulating part 113 are alternately disposed, and at least one of the first insulating part 112 and the second insulating part 113 has a width that is shorter than the wavelength region of the light detected by the photoelectric conversion unit 107. For example, the interlayer insulating film 102 and the first insulating part 112 may be formed of silicon oxide, and the second insulating part 113 may be formed of a silicon compound which includes carbon, oxygen or nitrogen.

The first insulating part 112 and the second insulating part 113 are disposed so that the effective refractive index in the planar lens structure 105 is largest at the center, and decreases as the distance from the center increases. Therefore the volume ratio of the second insulating part 113 in the planar lens structure 115 gradually decreases from the center region to the peripheral region of the planar lens structure 115. The effective refractive index is an average refractive index in regions of which size is the same as or more than the wavelength of the detection target light.

By this configuration, the planar lens structure 115 can implement an effect similar to the lens structure of which upper surface is convex. Because of the convex lens effect of the planar lens structure 115, a ray 202 can be refracted toward the center of the planar lens structure 115, as illustrated in FIG. 8. By this configuration, entry of the light reflected by the wires 101 into the adjacent photoelectric conversion units 107 can be prevented.

It is preferable that the wires 101 are disposed immediately below the planar lens structure 115. Thereby the light refracted by the planar lens structure 115 toward the center returns to the photoelectric conversion unit 107, and sensitivity improves.

Figure 9:
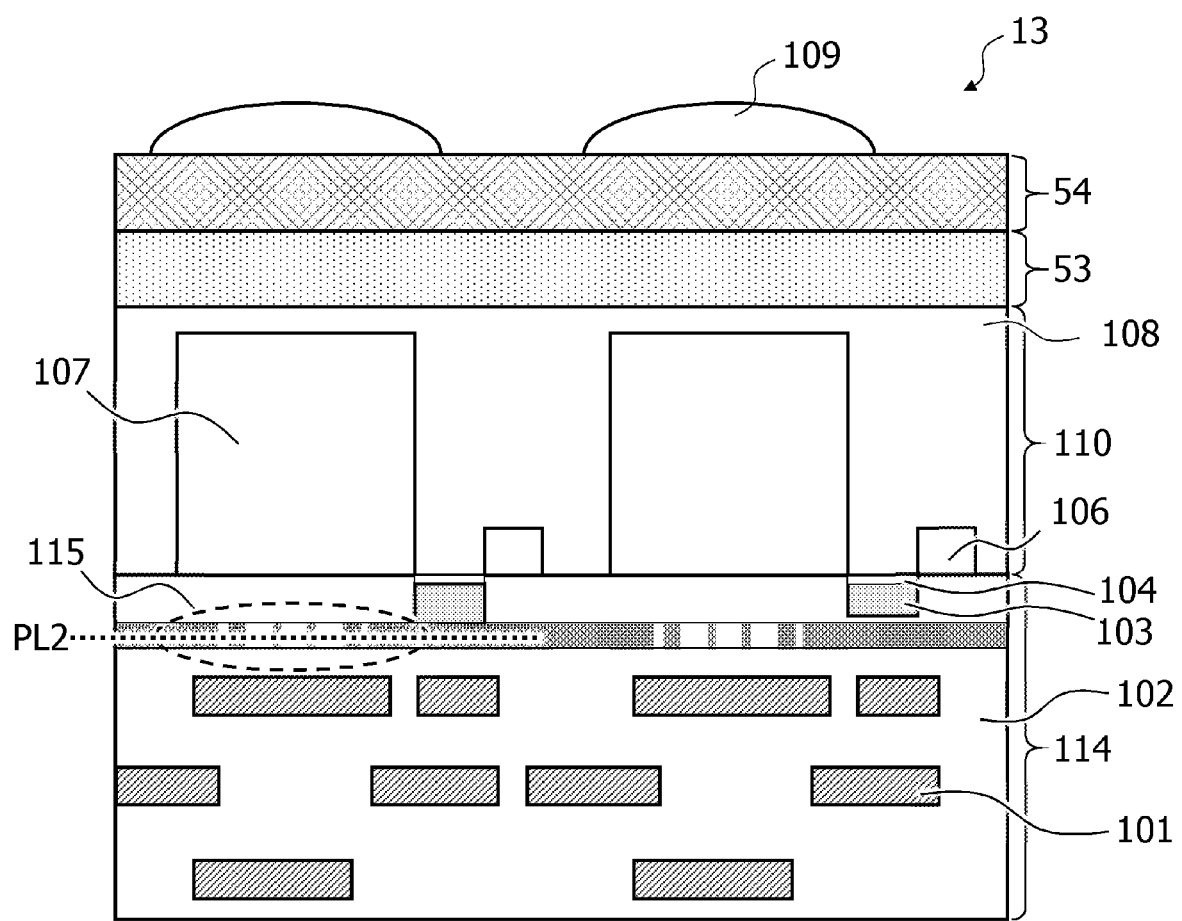
FIG. 9 is a diagram depicting another configuration example of a pixel according to Embodiment 2.

In FIG. 7, the planar lens structure 115 is disposed so as to cover the photoelectric conversion unit 107, but as illustrated in FIG. 9, the pixel 14 may be disposed so that the pixel region, excluding the region of the photoelectric conversion unit 107, is covered by the second insulation part 113. By this configuration, the flatness of the wiring layer 114 can be improved.

Figure 10A:
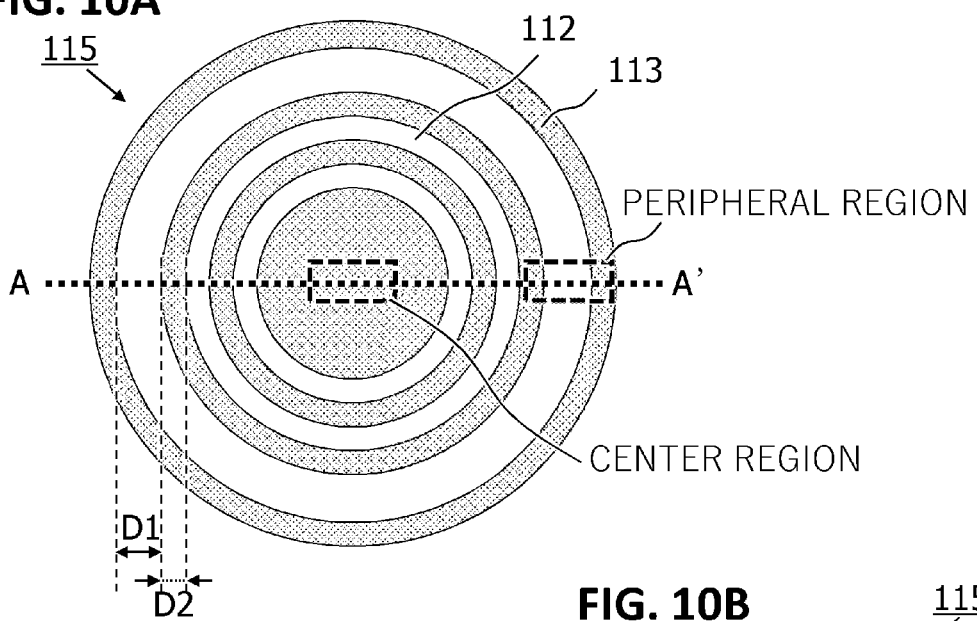
FIG. 10A to FIG. 10C are diagrams depicting layout pattern examples of the planar lens structure of Embodiment 2.
Figure 10B:
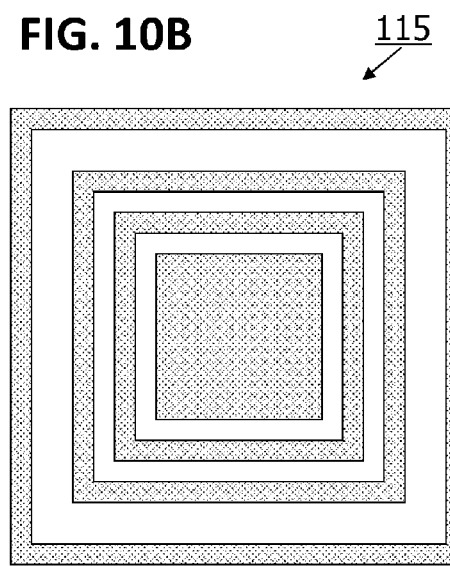
Figure 10C:
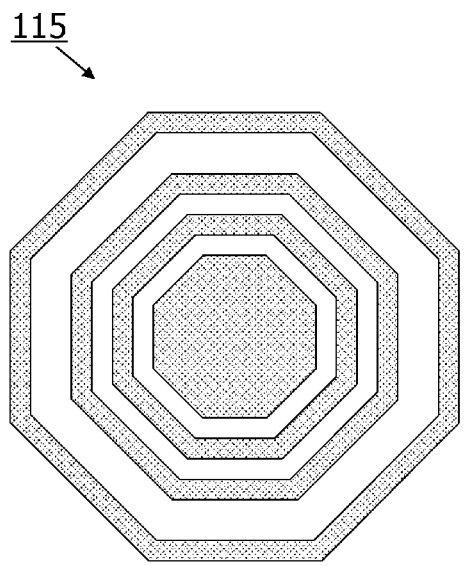

An example of a layout pattern in the planar lens structure 115 illustrated in FIG. 7 will be described with reference to FIG. 10A to FIG. 10C. FIG. 10A to FIG. 10C are diagrams depicting examples of the layout pattern in the planar lens structure 115. In FIG. 10A to FIG. 10C, the patched regions are regions of the second insulating parts 113, and the white regions between the hatched regions are regions of the first insulating parts 112.

The layout pattern illustrated in FIG. 10A is disposed on the plane PL2 in FIG. 7, and is a concentric pattern. A concentric pattern is formed to have a predetermined volume ratio distribution of the second insulating part 113, which is required in the planar lens structure 115. In the center region of the concentric circles of the planar lens structure 115, the volume ratio of the second insulating part 113, which has a refractive index higher than the refractive index of the first insulating part 112, is large. In the peripheral region of the concentric circles of the planar lens structure 115, the volume ratio of the second insulating part 113, which has the higher refractive index, is small. Thereby the effective refractive index of the center region of the planar lens structure 115 becomes higher than the effective refractive index of the peripheral region.

Figure 11:
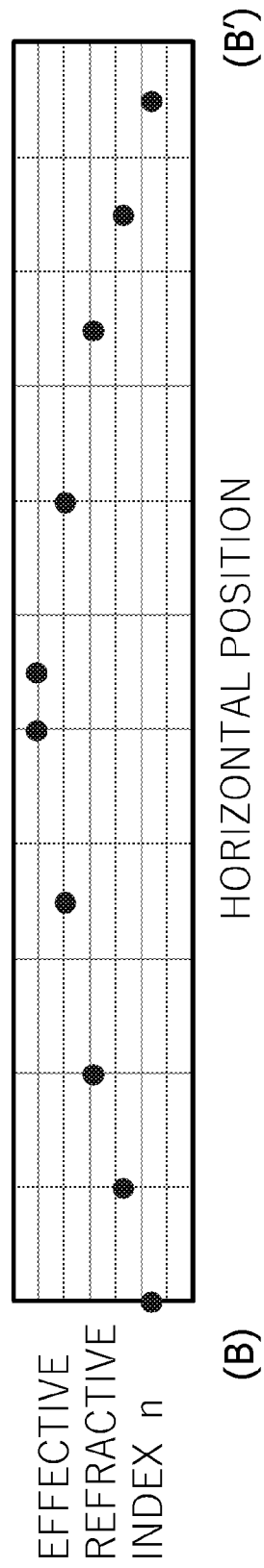
FIG. 11 is a diagram depicting a distribution of the effective refractive index of the layout pattern illustrated in FIG. 10A.

For example, in the layout pattern illustrated in FIG. 10A, the effective refractive index was calculated at a plurality of points in the BB' cross-section, and the simulation result in FIG. 11 was acquired. The effective refractive index is a numeric value that indicates a substantial refractive index at a certain position with respect to a wavelength of a certain incident light, and is approximately the same as the average value of the refractive index in the vicinity of the position.

The plane pattern is a micro pattern that is not more than the wavelength, hence films having different refractive indexes exist at a cycle shorter than the wavelength. As illustrated in FIG. 10A, the volume ratio of the second insulating part 113 is large in the center region of the concentric circles of the planar lens structure 115, and the volume ratio of the second insulating part 113 is small in the peripheral region of the concentric circles of the planar lens structure 115. As a result, the effective refractive index is highest at the center region of the concentric circles, and decreases as the distance from the peripheral region decreases.

In FIG. 10A, it is assumed that the width of the first insulating part 112 is D1, and the width of the second insulating part 113 is D2. The width D1 and the width D2 are the length of the first insulating part 112 and the length of the second insulating part 113 on an arbitrary line passing through the center of the planar lens structure 105 (e.g. AA'). In the case of the example illustrated in FIG. 10A, the width D1 of the first insulating part 112 is formed to be smaller as the distance from the center decreases, and larger as the distance from the center increases. The width D2 of the second insulating part 113 is formed to be larger as the distance from the center decreases, and smaller as the distance from the center increases. Then the volume ratio of the second insolating part 113 increases as the distance from the center region decreases, and the volume ratio of the second insulating part 113 decreases as the distance from the peripheral region decreases. In other words, the effective refractive index increases as the distance from the center region decreases, and the effective refractive index decreases as the distance from the peripheral region decreases.

However, a plane pattern, other than the pattern of simultaneously changing the width D1 of the first insulating part 112 and the width D2 of the second insulating part 113, may be used. For example, a pattern of decreasing the width D2 of the second insulating part 113 as the distance from the center increases, without changing the width D1 of the first insulating part 112, or a pattern of increasing the width D1 of the first insulating part 112 as the distance from the center increases, without changing the width D2 of the second insulating part 113, may be used.

The method of changing the volume ratio of the second insulating part 113 in the planar lens structure 115 is not limited to the above example.

By this configuration, the ray 202 can be refracted toward the center of the planar lens structure 115. By this configuration, entry of the light reflected by the wires 101 into the adjacent photoelectric conversion units can be prevented, and more satisfactory pixel signals can be generated.

In the same manner, the layout pattern illustrated in FIG. 10B is disposed on the plane PL2, and is a concentric square ring pattern. The concentric square ring pattern is formed to have a predetermined volume ratio distribution, which is required in the planar lens structure 115. In the center region of the concentric square rings of the planar lens structure 115, the volume ratio of the second insulating part 113, which has a refractive index higher than the refractive index of the first insulating part 112, is large. In the peripheral region of the concentric square rings of the planar lens structure 115, the volume ratio of the second insulating part 113, having a higher refractive index, is small. Thereby the effective refractive index of the center region of the planar lens structure 115 becomes higher than the effective refractive index of the peripheral region.

In the same manner, the layout pattern illustrated in FIG. 10C is disposed on the plane PL2, and is a concentric polygonal ring pattern (e.g. hexagonal ring pattern). In FIG. 10C, the polygonal ring pattern is a hexagon, but may be other polygonal ring patterns. The concentric polygonal ring pattern is formed to have a predetermined volume ratio distribution which is required in the planar lens structure 115. In the center region of the concentric polygonal rings of the planar lens structure 115, the volume ratio of the second insulating part 113, which has a refractive index higher than the refractive index of the first insulating part 112, is large. In the peripheral region of the concentric polygonal rings of the planar lens structure 115, the volume ratio of the second insulating part 113, having a higher refractive index, is small. Thereby the effective refractive index of the center region of the planar lens structure 115 becomes higher than the effective refractive index of the peripheral region.

In the case where the inclination of the incident light is different, depending on the position of the pixel in the pixel array, the volume ratio distribution in the planar lens structure 115 of the layout pattern, may be decentered, as described in the first embodiment (illustration omitted). In other words, in the planar lens structure 115, a position at which the effective refractive index is highest (reference point) may deviate from the center of the planar lens structure 115 or the center of the photoelectric conversion unit 107. By this configuration, entry of the light reflected by the wires 101 into the adjacent photoelectric conversion units can be more effectively prevented, and more satisfactory pixel signals can be generated.

Third Embodiment

Figure 12:
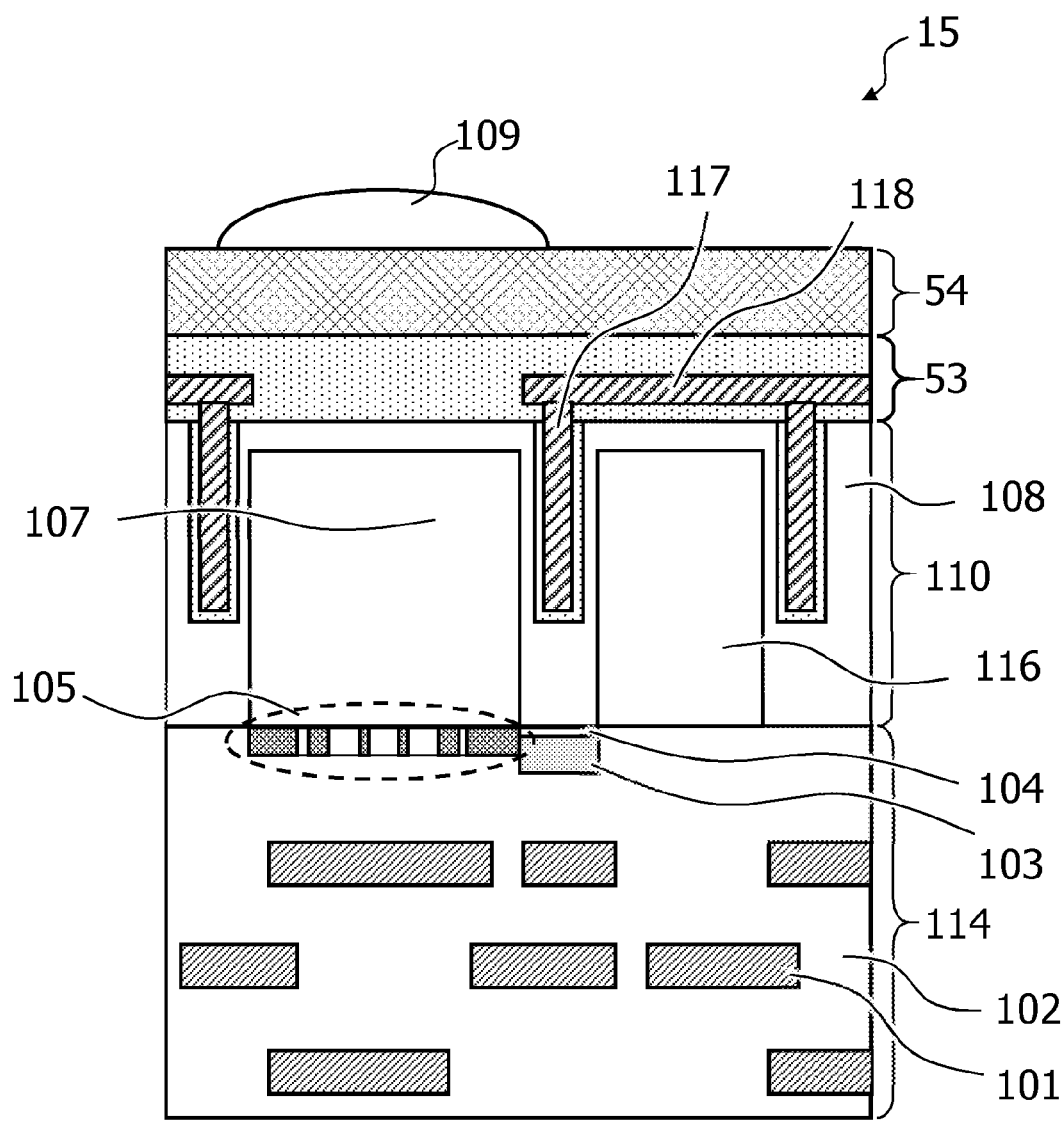
FIG. 12 is a cross-sectional view depicting a configuration example of a pixel according to Embodiment 3.

FIG. 12 is a cross-sectional view depicting a configuration example of a pixel according to the third embodiment. In the following, differences from the first embodiment will be mainly described. A difference of the pixel according to the third embodiment from the first embodiment is that the photoelectric conversion unit 107 includes a charge holding unit 116, which temporarily holds stored charges. Since the charge holding unit 116 is included, the exposure timing at each pixel becomes the same, that is, a global shutter can be implemented.

As illustrated in FIG. 12, in a semiconductor substrate 110, the charge holding unit 116 is disposed adjacent to the photoelectric conversion unit 107. In the third embodiment, a transfer gate 103 transfers the charges stored in the photoelectric conversion unit 107 to the charge holding unit 116.

In a dielectric material layer 53, a light-shielding film 118 and a light-shielding wall 117, which are formed of a material having light-shielding properties, are embedded. The light-shielding film 118 is formed on the light-receiving side (upper side in FIG. 12) of the photoelectric conversion unit 107. The light-shielding film 118 is formed so as to cover at least a part, preferably all, of the charge holding unit 116. The light-shielding film 118 covering the charge holding unit 116 refers to the region of the charge holding unit 116 that is included in the region of the light-shielding film 118 in the plan view. It is preferable that the light-shielding film 118 is formed to cover all regions of the charge holding unit 116, excluding the region of the photoelectric conversion unit 107. Then the incident light to the charge holding unit 116 can be further decreased. If the light-shielding film 118 is formed of such materials as tungsten, aluminum and copper, entry of the incident light into the charge holding unit 116 can be more effectively prevented.

The planar lens structure 105 is constituted of the first insulating part 112 and the second insulating part 113 of which refractive indexes are different, and implements an effect similar to the lens structure of which upper surface is concave. Description on the configuration and the layout pattern of the planar lens structure 105, which are the same as the first embodiment, is omitted.

According to the third embodiment, not only preventing entry of the light reflected by the interface 111 into the adjacent photoelectric conversion units, but also direct entry of the light collected by the on-chip lens 109 into the charge holding unit 116 can be decreased, whereby more satisfactory pixel signals can be generated.

Instead of the planar lens structure 105 illustrated in FIG. 12, the planar lens structure 115 may be configured between the wires 101 and the semiconductor substrate 108, as illustrated in FIG. 7 (the second embodiment). The planar lens structure 115 implements an effect similar to the lens structure of which upper surface is convex. Therefore not only preventing entry of the light reflected by the wires 101 into the adjacent photoelectric conversion unit, but also direct entry of the light collected by the on-chip lens 109 into the charge holding unit 116 can be decreased, whereby more satisfactory pixel signals can be generated.

Fourth Embodiment

Figure 13:
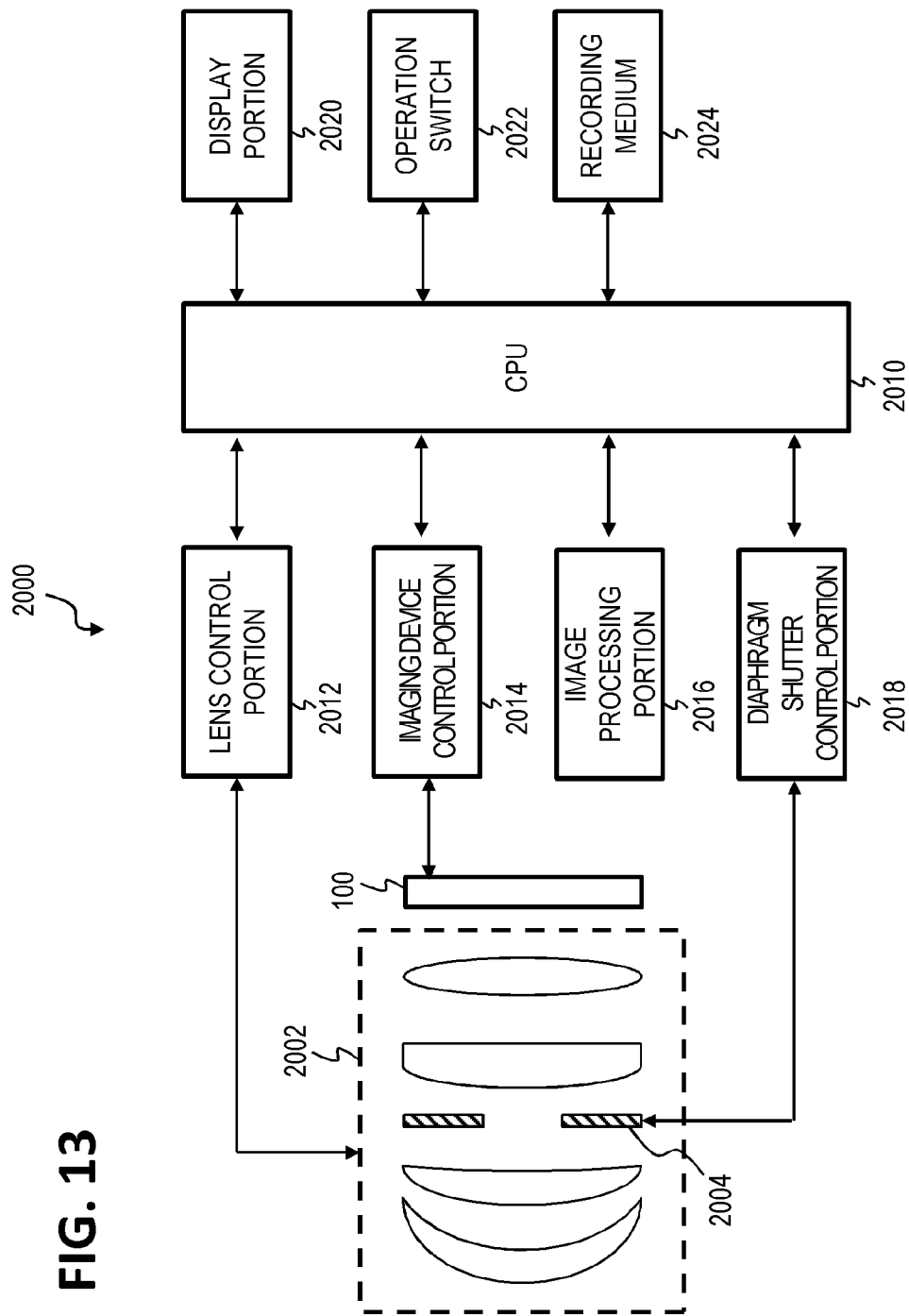
FIG. 13 is a diagram depicting a configuration example of an imaging system according to Embodiment 4.

An imaging system according to a fourth embodiment of the present invention will be explained with reference to FIG. 13. FIG. 13 is a block diagram of a schematic configuration of an imaging system according to this embodiment.

The solid-state imaging devices (photoelectric conversion devices) described in the above first to third embodiments may apply to various imaging systems. Applicable imaging systems may include, but are not limited to, various types of equipment such as a digital still camera, a digital camcorder, a monitor camera, a copying machine, a facsimile, a mobile phone, an in-vehicle camera, an observation satellite, a medical camera, or the like. The imaging systems may also include a camera module including an optical system such as a lens and a solid-state imaging device (photoelectric conversion device). FIG. 13 is a block diagram of a digital still camera as an example of those imaging systems.

FIG. 13 shows an imaging system 2000, which includes an imaging device 100, an imaging optical system 2002, a CPU 2010, a lens control portion 2012, an imaging device control portion 2014, an image processing portion 2016, and a diaphragm shutter control portion 2018. The imaging system 2000 also includes a display portion 2020, an operation switch 2022, and a recording medium 2024.

The imaging optical system 2002 is an optical system for forming an optical image of the subject, and includes a lens group, a diaphragm 2004, or the like. The diaphragm 2004 has a function of adjusting light intensity during photography by adjusting its opening size. The diaphragm 2004 also functions as an exposure time adjustment shutter during still image photography. The lens group and the diaphragm 2004 are held movable forward and backward in the optical axis direction. These linked operations may provide a scaling function (zoom function) and a focus adjustment function. The imaging optical system 2002 may be integrated into the imaging system or may be an imaging lens mountable to the imaging system.

The imaging device 100 is disposed such that its imaging plane is positioned in the image space of the imaging optical system 2002. The imaging device 100 is one of the solid-state imaging devices (photoelectric conversion devices) explained in the first to third embodiments. The imaging device 100 includes a CMOS sensor (pixel portion) and its peripheral circuits (peripheral circuit area). The imaging device 100 includes a plurality of pixels arranged in two dimensions, each pixel including a photoelectric conversion portion. These pixels are provided with color filters to form a two-dimensional single-plate color sensor. The imaging device 100 may photoelectrically convert a subject image imaged by the imaging optical system 2002 for output as an image signal and/or a focus detection signal.

The lens control portion 2012 is to control the forward and backward driving of the lens group in the imaging optical system 2002 to perform scaling operation and focus adjustment. The lens control portion 2012 includes a circuit and/or processing unit configured to achieve those functions. The diaphragm shutter control portion 2018 is to change the opening size of the diaphragm 2004 (for a variable diaphragm value) to adjust light intensity during photography, and is constituted of a circuit and/or processing unit configured to achieve those functions.

The CPU 2010 is a control unit in a camera responsible for various controls of the camera bod, and includes an operation portion, a ROM, a RAM, an A/D converter, a D/A converter, a communication interface circuit, or the like. The CPU 2010 controls the operation of each portion in the camera according to a computer program stored in a ROM or the like. The CPU 2010 performs a series of photography operations such as AF, imaging, image processing, and recording, including detection of the focus state (focus detection) of the imaging optical system 2002. The CPU 2010 also serves as a signal processing portion.

The imaging device control portion 2014 is to control the operation of the imaging device 100 and to A/D convert a signal output from the imaging device 100 and transmit the result to the CPU 2010, and includes a circuit and/or control unit configured to achieve those functions. The imaging device 100 may have the A/D conversion function. The image processing portion 2016 is a processing unit that subjects the A/D converted signal to processing such as □ conversion and color interpolation to generate an image signal. The image processing portion 2016 includes a circuit and/or control unit configured to achieve those functions. The display portion 2020 is a display device such as a liquid crystal display device (LCD), and displays information related to a photography mode of the camera, a preview image before photography, a check image after photography, the focused state at the focus detection, or the like. The operation switch 2022 includes a power supply switch, a release (photography trigger) switch, a zoom operation switch, a photography mode selection switch, or the like. The recording medium 2024 is to record a photographed image or the like, and may be built in the imaging system or removable such as a memory card.

In this way, the imaging system 2000 applied with the imaging device 100 according to the first to third embodiments may provide a high performance imaging system.

Fifth Embodiment

Figure 14A:
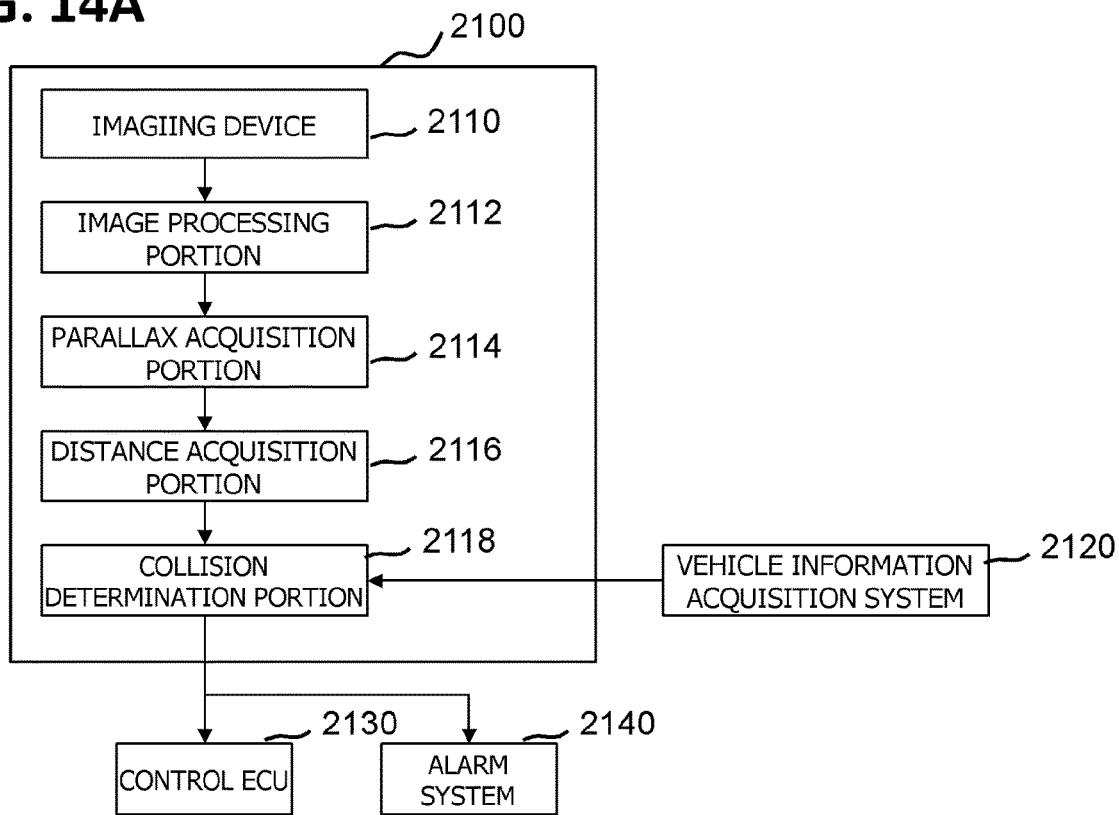
FIG. 14A and FIG. 14B are diagrams depicting configuration examples of an imaging system and a mobile body according to Embodiment 5.
Figure 14B:
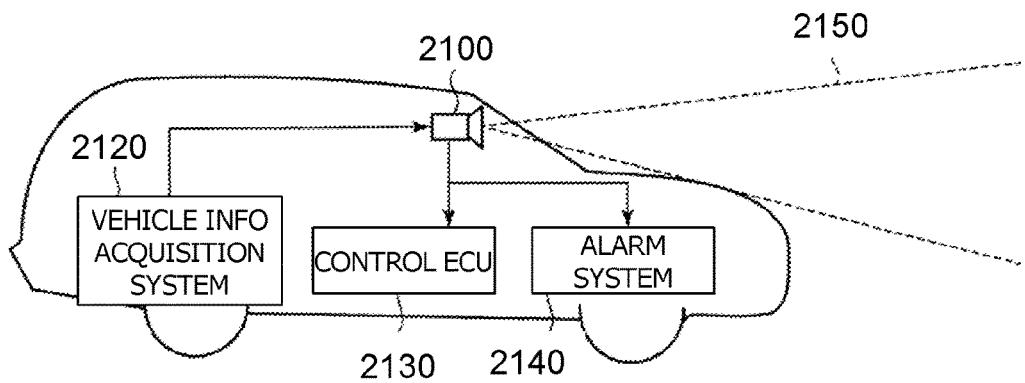

An imaging system and a mobile object according to a fifth embodiment of the present invention will be explained with reference to FIGS. 14A and 14B. FIGS. 14A and 14B show configurations of the imaging system and mobile object according to this embodiment.

FIG. 14A shows an example of an imaging system 2100 associated with an in-vehicle camera. The imaging system 2100 has an imaging device 2110. The imaging device 2110 is any one of the solid-state imaging devices (photoelectric conversion devices) according to the above first to fourth embodiments. The imaging system 2100 has an image processing portion 2112 and a parallax acquisition portion 2114. The image processing portion 2112 is a processing unit that subjects a plurality of sets of image data acquired by the imaging device 2110 to image processing. The parallax acquisition portion 2114 is a processing unit that calculates parallax (a phase difference of a parallax image) from the sets of image data acquired by the imaging device 2110. The imaging system 2100 also includes a distance acquisition portion 2116, which is a processing unit that calculates the distance to the subject based on the calculated parallax. The imaging system 2100 also includes a collision determination portion 2118, which is a processing unit that determines a possibility of collision based on the calculated distance. Here, the parallax acquisition portion 2114 and the distance acquisition portion 2116 are examples of information acquiring means that acquires information such as distance information to the subject. In other words, the distance information is information related to parallax, defocus amount, the distance to the subject, or the like. The collision determination portion 2118 may determine a possibility of collision using any of the distance information. The above processing unit may be provided by specially designed hardware or may be provided by general hardware that performs operation based on a software module. In addition, the processing unit may be provided by a Field Programmable Gate Array (FPGA), an Application Specific Integrated Circuit (ASIC), or the like or may be provided by a combination thereof.

The imaging system 2100 is connected to a vehicle information acquisition system 2120, and may thus acquire vehicle information including a vehicle speed, a yaw rate, and a rudder angle. The imaging system 2100 also has a control ECU 2130 connected thereto. The ECU 2130 is a control unit that outputs a control signal for generating a braking force to the vehicle based on the determination by the collision determination portion 2118. In other words, the control ECU 2130 is an example of a mobile object control means that controls a mobile object based on the distance information. The imaging system 2100 is also connected to an alarm system 2140. The alarm system 2140 gives an alarm to the driver based on the determination by the collision determination portion 2118. For example, if the collision determination portion 2118 determines a high possibility of collision, the control ECU 2130 performs a vehicle control that avoids collision and reduces damage by braking, releasing the accelerator, limiting the engine output, or the like. The alarm system 2140 warns the user by sounding an alarm such as sound, displaying alarm information on a screen of a car navigation system or the like, giving vibration to a seatbelt and steering, or the like.

In this embodiment, the surroundings of the vehicle such as front or rear are imaged by the imaging system 2100. FIG. 14B shows the imaging system 2100 when imaging the front of the vehicle (imaging range 2150). The vehicle information acquisition system 2120 directs the imaging system 2100 to operate and perform imaging. Using the imaging devices according to the above first to fourth embodiments as the imaging device 2110, the imaging system 2100 in this embodiment may provide more improved ranging accuracy.

Although the above description shows an example control that prevents collision with other vehicles, the present invention may also apply to a control of autonomous driving following other vehicles, a control of autonomous driving preventing running over a traffic lane, or the like. In addition to a vehicle such as a car, the imaging system may also apply to, for example, a mobile object (transportation equipment) such as a vessel, an aircraft, or an industrial robot. The moving device in the mobile object (transportation equipment) is one of various types of drive sources, including an engine, a motor, a wheel, and a propeller. In addition to a mobile object, the imaging system may also apply to equipment, such as Intelligent Transport Systems (ITS), that commonly uses the object recognition.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-85736, filed on Apr. 26, 2019, which is hereby incorporated by reference herein in its entirety.

What is claimed is:

1. A photoelectric conversion apparatus, comprising:
a photoelectric conversion unit that converts received light into charges; and
an optical structure that is disposed on the opposite side of a light-receiving surface of the photoelectric conversion unit,
wherein the optical structure includes a plurality of first insulating parts and a plurality of second insulating parts,
wherein a refractive index of the first insulating part is lower than a refractive index of the second insulating part,
wherein at least one of the first insulating part and the second insulating part is disposed at intervals shorter than a wavelength of a detection target light, and
wherein an effective refractive index of the optical structure is lowest at a reference point and increases as the distance from the reference point increases, or is highest at the reference point and decreases as the distance from the reference point increases.

2. The photoelectric conversion apparatus according to claim 1,
wherein the optical structure is disposed on the front surface of a wiring layer which is adjacent to a semiconductor substrate on which the photoelectric conversion unit is disposed, and
wherein the effective refractive index of the optical structure is lowest at the reference point and increases as the distance from the reference point increases.

3. The photoelectric conversion apparatus according to claim 1,
wherein the optical structure is disposed inside the wiring layer which is adjacent to a semiconductor substrate on which the photoelectric conversion unit is disposed, and
wherein the effective refractive index of the optical structure is highest at the reference point and decreases as the difference from the reference point increases.

4. A photoelectric conversion apparatus, comprising:
a photoelectric conversion unit that converts received light into charges; and
an optical structure that is disposed on the opposite side of the light-receiving surface of the photoelectric conversion unit,
wherein the optical structure includes a plurality of first insulating parts and a plurality of second insulating parts,
wherein a refractive index of the first insulating part is lower than a refractive index of the second insulating part,
wherein at least one of the first insulating part and the second insulating part is disposed at intervals shorter than a wavelength of a detection target light, and
wherein a volume ratio of the second insulating part in the optical structure is lowest at a reference point and increases as the distance from the reference point increases, or is highest at the reference point and decreases as the distance from the reference point increases.

5. The photoelectric conversion apparatus according to claim 4,
wherein the optical structure is disposed on the surface of a wiring layer which is adjacent to a semiconductor substrate on which the photoelectric conversion unit is disposed, and
wherein the volume ratio of the second insulating part in the optical structure is lowest at the reference point and increases as the distance from the reference point increases.

6. The photoelectric conversion apparatus according to claim 4,
wherein the optical structure is disposed inside a wiring layer which is adjacent to a semiconductor substrate on which the photoelectric conversion unit is disposed, and
wherein the volume ratio of the second insulating part in the optical structure is highest at the reference point and decreases as the distance from the reference point increases.

7. A photoelectric conversion apparatus, comprising:
a photoelectric conversion unit that converts received light into charges; and
an optical structure that is disposed on the opposite side of a light-receiving surface of the photoelectric conversion unit,
wherein the optical structure is disposed on the surface of a wiring layer which is adjacent to the semiconductor substrate on which the photoelectric conversion unit is disposed,
wherein the optical structure includes a plurality of first insulating parts and a plurality of second insulating parts,
wherein a refractive index of the first insulating part is lower than a refractive index of the second insulating part,
wherein the first insulating part and the second insulating part are ring-shaped or polygonal ring-shaped, and are disposed alternately,
wherein at least one of the first insulating part and the second insulating part has a width that is shorter than a wavelength of a detection target light, and
wherein (1) the width of the first insulating part increases as the distance from a reference point decreases, and decreases as the distance from the reference point increases, and/or (2) the width of the second insulating part decreases as the distance the reference point decreases, and increases as the distance from the reference point increases.

8. A photoelectric conversion apparatus, comprising:
a photoelectric conversion unit that converts received light into charges; and
an optical structure that is disposed on the opposite side of the light-receiving surface of the photoelectric conversion unit,
wherein the optical structure is disposed inside a wiring layer which is adjacent to a semiconductor substrate on which the photoelectric conversion unit is disposed,
wherein the optical structure includes a plurality of first insulating parts and a plurality of second insulating parts,
wherein a refractive index of the first insulating part is lower than a refractive index of the second insulating part,
wherein the first insulating part and the second insulating part are ring-shaped or polygonal ring-shaped, and are disposed alternately,
wherein at least one of the first insulating part and the second insulating part has a width that is shorter than a wavelength of a detection target light, and
wherein (1) the width of the first insulating part decreases as the distance from a reference point decreases, and increases as the distance from the reference point increases, and/or (2) the width of the second insulating part increases as the distance from the reference point decreases, and decreases as the distance from the reference point increases.

9. The photoelectric conversion apparatus according to claim 1, wherein the reference point is the center of the optical structure or the center of the photoelectric conversion unit.

10. The photoelectric conversion apparatus according to claim 1, wherein the reference point is a position that deviates from the center of the optical structure or the center of the photoelectric conversion unit.

11. The photoelectric conversion apparatus according to claim 1, wherein the second insulating part is disposed so as to cover a pixel region, excluding the region of the photoelectric conversion unit.

12. The photoelectric conversion apparatus according to claim 1, further comprising:
a charge holding unit that temporarily holds charges transferred from the photoelectric conversion unit; and a light-shielding film that covers at least a part of the charge holding unit which is disposed on the light-receiving surface side of the photoelectric conversion unit.

13. The photoelectric conversion apparatus according to claim 12, further comprising: a light-shielding wall which is disposed between the photoelectric conversion unit and the charge holding unit.

14. An imaging system, comprising:
the photoelectric conversion apparatus according to claim 1; and
a signal processing unit that processes a signal outputted from the photoelectric conversion apparatus.

15. A mobile body, comprising:
the photoelectric conversion apparatus according to claim 1;
a mobile apparatus;
a processor that acquires information from a signal outputted from the photoelectric conversion apparatus; and
a controller that controls the mobile apparatus based on the information.

* * * * *